(12) United States Patent
Lyu

(10) Patent No.: US 9,717,159 B2
(45) Date of Patent: Jul. 25, 2017

(54) MAINFRAME COMPUTER WITH SUPPORTING RACK

(71) Applicant: COOLER MASTER TECHNOLOGY INC., New Taipei (TW)

(72) Inventor: Yu-Qing Lyu, New Taipei (TW)

(73) Assignee: COOLER MASTER TECHNOLOGY INC., New Taipei (TW)

( * ) Notice: Subject to any disclaimer, the term of this patent is extended or adjusted under 35 U.S.C. 154(b) by 0 days.

(21) Appl. No.: 14/804,098

(22) Filed: Jul. 20, 2015

(65) Prior Publication Data

US 2016/0353602 A1    Dec. 1, 2016

(30) Foreign Application Priority Data

Jun. 1, 2015    (TW) .............................. 104208640 U

(51) Int. Cl.
*H05K 7/14*    (2006.01)

(52) U.S. Cl.
CPC ................................. *H05K 7/1488* (2013.01)

(58) Field of Classification Search
CPC ................ H05K 7/1489; H05K 7/20781
See application file for complete search history.

(56) References Cited

U.S. PATENT DOCUMENTS

| 5,128,830 | A | * | 7/1992 | Deluca | H01R 13/6315 |
| | | | | | 361/679.02 |
| 9,292,057 | B2 | * | 3/2016 | Cox | G06F 1/20 |
| 2004/0037046 | A1 | * | 2/2004 | Dittus | H05K 7/1489 |
| | | | | | 361/724 |
| 2004/0120106 | A1 | * | 6/2004 | Searby | G06F 1/181 |
| | | | | | 361/679.58 |
| 2012/0250261 | A1 | * | 10/2012 | Peng | H05K 7/1489 |
| | | | | | 361/724 |
| 2014/0167576 | A1 | * | 6/2014 | Tang | H05K 7/1489 |
| | | | | | 312/223.1 |
| 2015/0077930 | A1 | * | 3/2015 | Kadotani | H05K 7/20781 |
| | | | | | 361/679.53 |
| 2016/0097229 | A1 | * | 4/2016 | Chen | A47B 88/04 |
| | | | | | 16/94 R |
| 2016/0165761 | A1 | * | 6/2016 | Cox | G06F 1/20 |
| | | | | | 361/679.53 |

* cited by examiner

*Primary Examiner* — Lisa Lea Edmonds
(74) *Attorney, Agent, or Firm* — Maschoff Brennan

(57) ABSTRACT

A mainframe computer with a supporting rack includes: a rack chassis and a supporting rack. The rack chassis has a first rack, and the first rack has a plurality of first positioning members. The supporting rack is arranged on the rack chassis, and the supporting rack has at least one first corresponding positioning member positioned corresponding to any one of at least one first positioning member. Therefore, the rack chassis and the support rack allow various types of objects (such as: solid state disk, cooling liquid tanks for cooling, hard drive or optical drive and so on) to be easily and conveniently installed onto the mainframe computer.

14 Claims, 17 Drawing Sheets

MAINFRAME COMPUTER WITH SUPPORTING RACK

BACKGROUND OF THE INVENTION

Field of the Invention

The present invention is related to a mainframe computer, in particular, to a mainframe computer with a supporting rack.

Description of Related Art

For a mainframe computer, it typically comprises: a mainframe rack, hard drive rack, optical drive rack, hard drives, optical drives, mainboard and a plurality of interface cards inserted onto the mainboard. The hard drive rack and the optical drive rack are installed on the mainframe rack respectively, the hard drives and the optical drives are received on the hard drive rack and the optical drive rack respectively while being electrically connected to the mainboard.

Nevertheless, the configurations of currently existing mainframe computer cannot satisfy the needs; for example, the needs for increasing the storage capacity, the needs for improving the system performance and the needs for enhancing the heat dissipating performance and so on, and the currently existing mainframe computers can only incorporate further components based on the original structure. However, such degree of addition and incorporation of further components onto the original structure still cannot satisfy the increasing needs, and this is a known issue troubling related people and the industry for a long time.

Therefore, the inventor seeks provide a solution capable of overcoming the aforementioned drawbacks associated with the known arts with a unique invention.

SUMMARY OF THE INVENTION

An objective of the present invention is to provide a mainframe computer with a supporting rack capable of allowing various objects (such as: solid state disk, cooling liquid tank for cooling, hard drive or optical drive and so on) to be easily and conveniently installed onto the mainframe computer.

To achieve the aforementioned objective, the present invention provides a mainframe computer comprising: a rack chassis having a first rack, the first rack having a plurality of first positioning members arranged thereon; and a supporting rack arranged on the rack chassis, the supporting rack having at least one first corresponding positioning member positioned corresponding to at least one of the plurality of first positioning members.

The present invention further provides a mainframe computer with a supporting rack, comprising: a rack chassis having a first rack and a second rack, the first rack having a plurality of first positioning members arranged thereon; the second rack having a plurality of second positioning members arranged thereon; and a supporting rack arranged on the rack chassis, the supporting rack having at least one first corresponding positioning member positioned corresponding to at least one of the plurality of first positioning members and at least one second corresponding positioning member positioned corresponding to at least one of the plurality of second positioning members.

In comparison to the prior arts, the present invention includes the at least following technical effects: the present invention is able to allow various objects (such as: solid state disk, cooling liquid tanks for cooling, hard drive or optical drive and so on) to be easily and conveniently installed onto the mainframe computer.

DETAILED DESCRIPTION OF THE INVENTION

The following provides a detailed description on the embodiments and technical content related to the present invention along with the accompanied drawings. However, it shall be understood that the accompanied drawings are provided for illustration purposes only and shall not be treated as limitations of the present invention.

Figure 1:
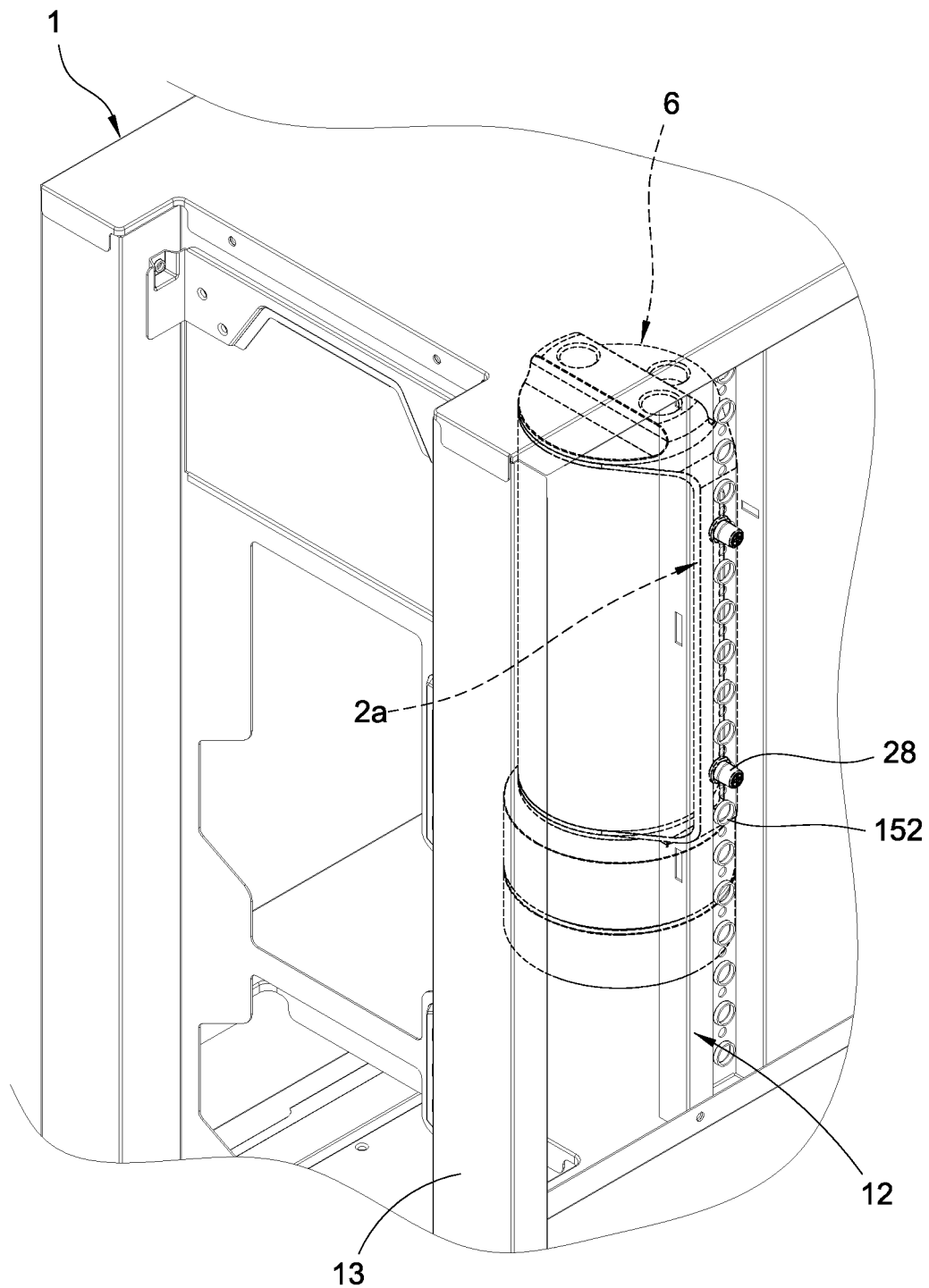
FIG. 1 is a partial perspective view of a mainframe computer according to a first embodiment of the present invention.
Figure 2:
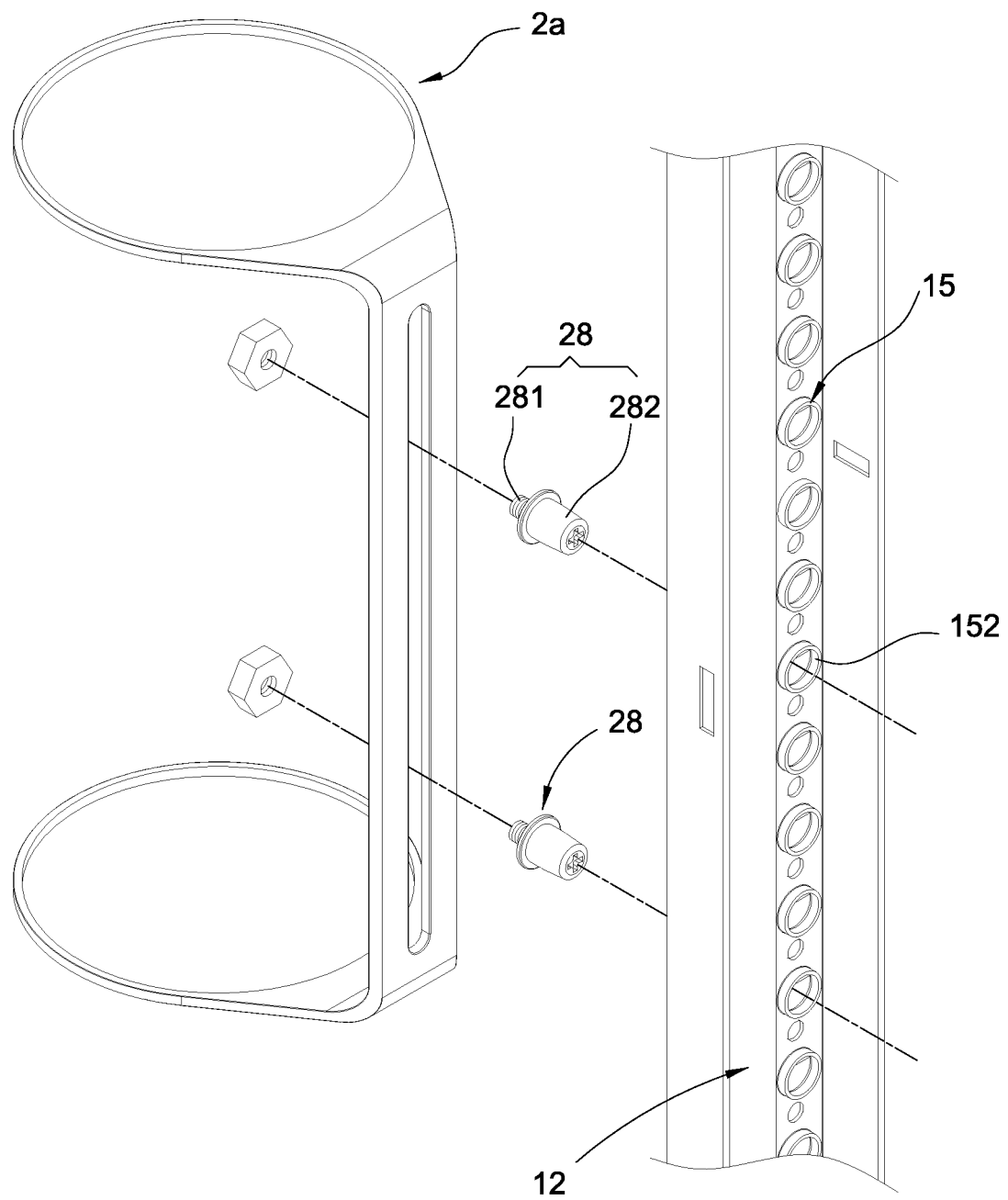
FIG. 2 is a perspective exploded view of the present invention according to FIG. 1.
Figure 3:
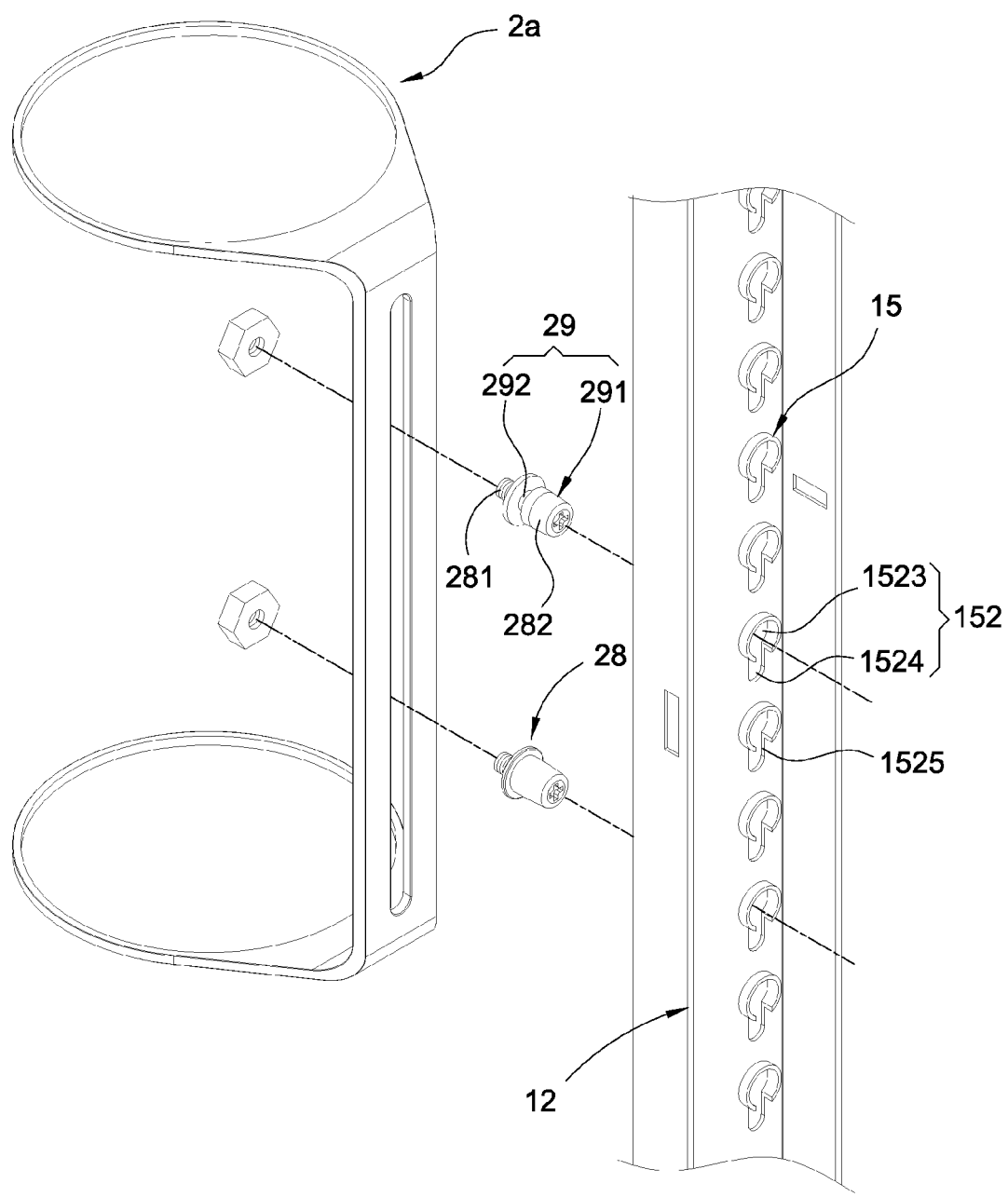
FIG. 3 is a partial perspective view of a mainframe computer according to a second embodiment of the present invention.
Figure 4:
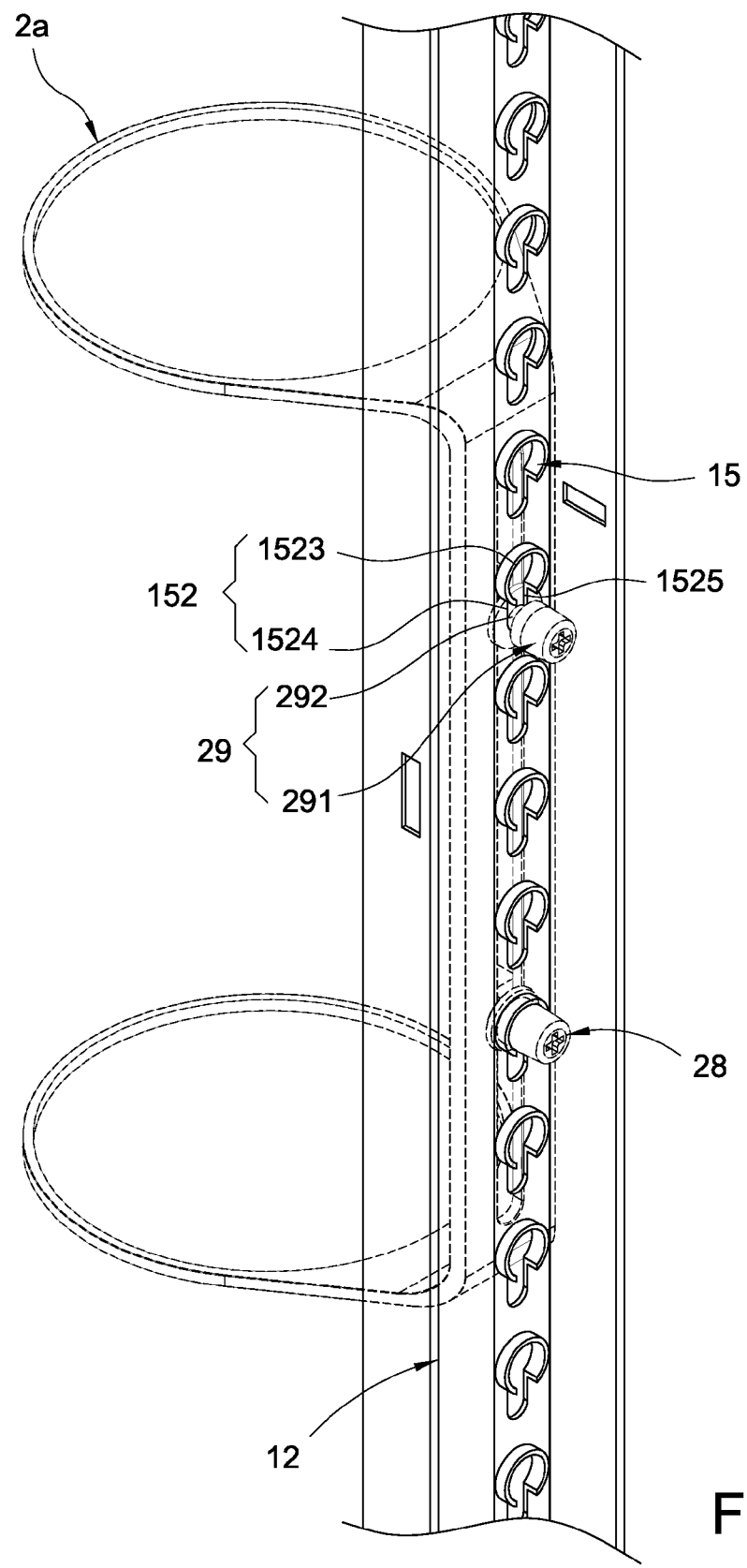
FIG. 4 is a partial perspective assembly view of the present invention according to FIG. 3.
Figure 5:
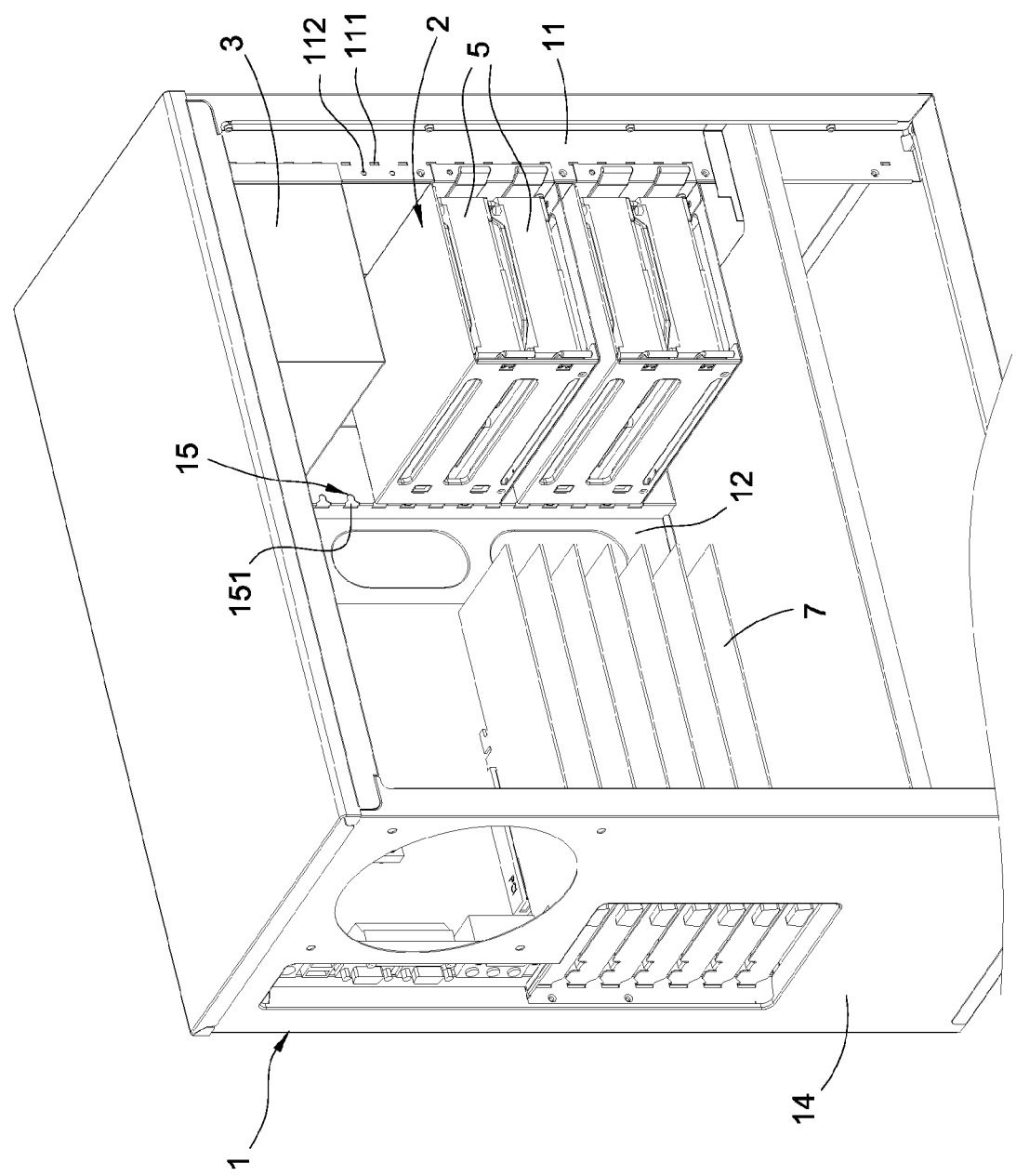
FIG. 5 is a perspective view of a mainframe computer according to a third embodiment of the present invention.
Figure 11:
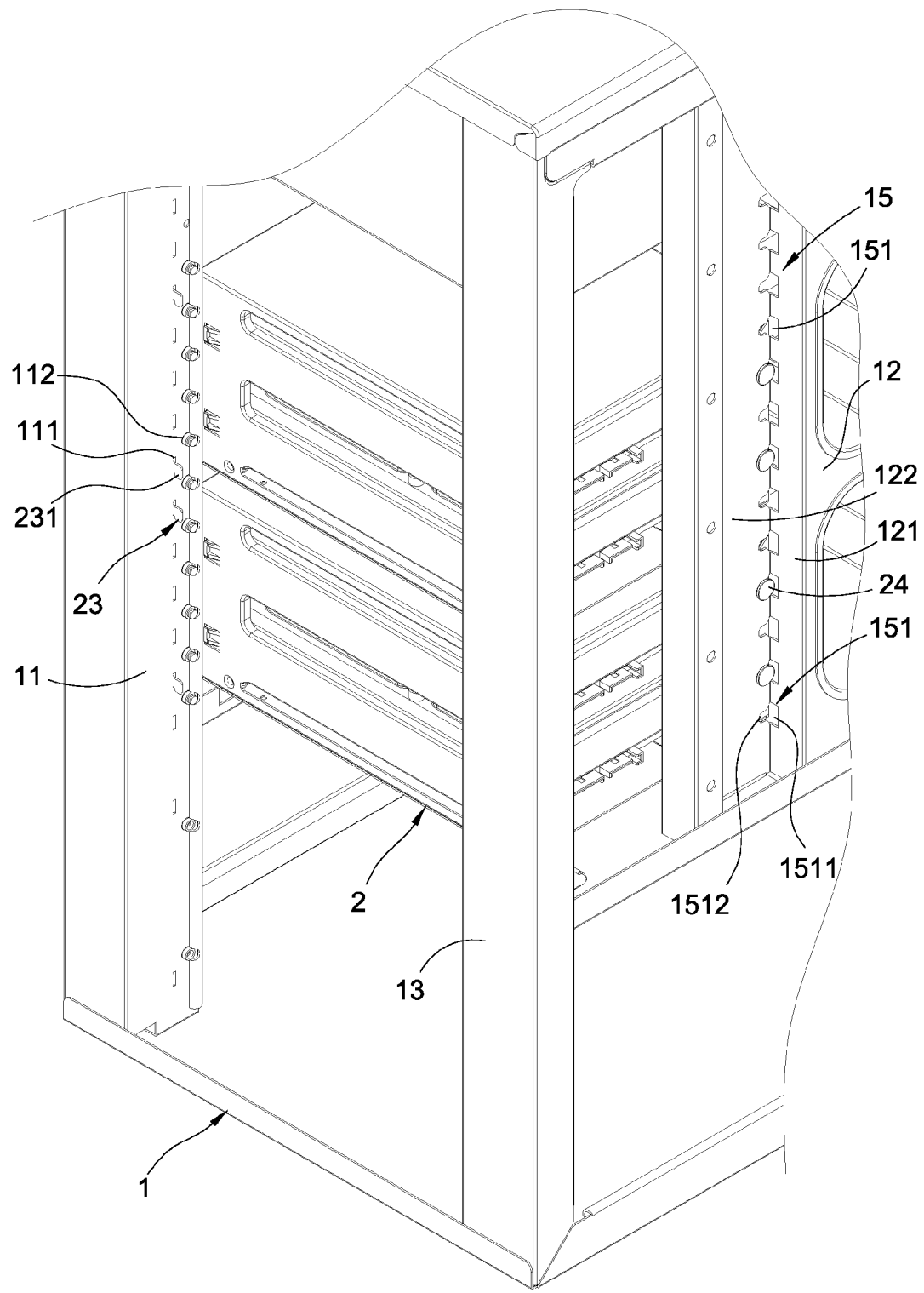
FIG. 11 is a perspective view of the present invention according to FIG. 6 after the installation of the supporting rack.
Figure 12:
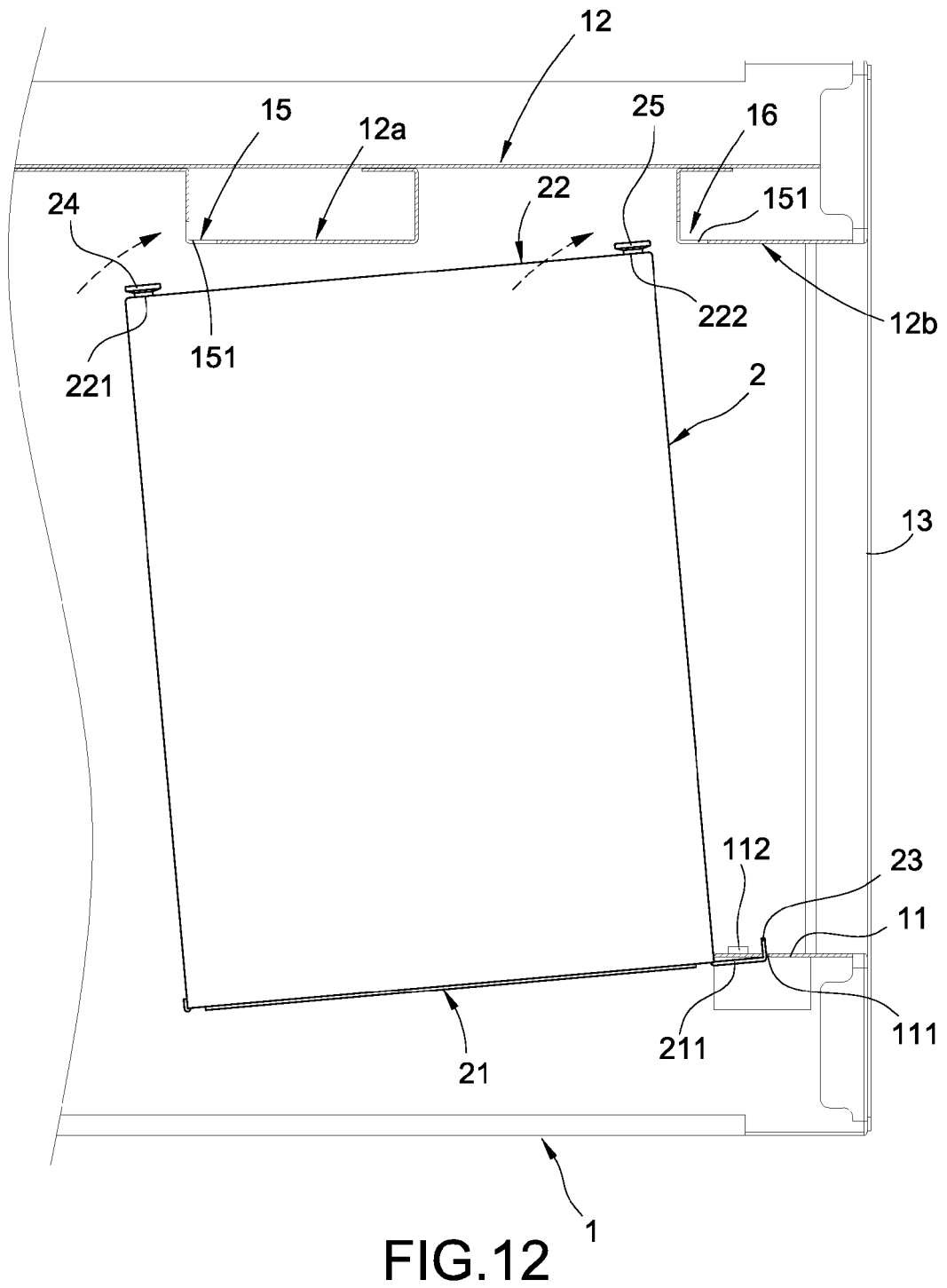
FIG. 12 is a top view of the mainframe compute according to a fourth embodiment of the present invention before the installation of the supporting rack.
Figure 13:
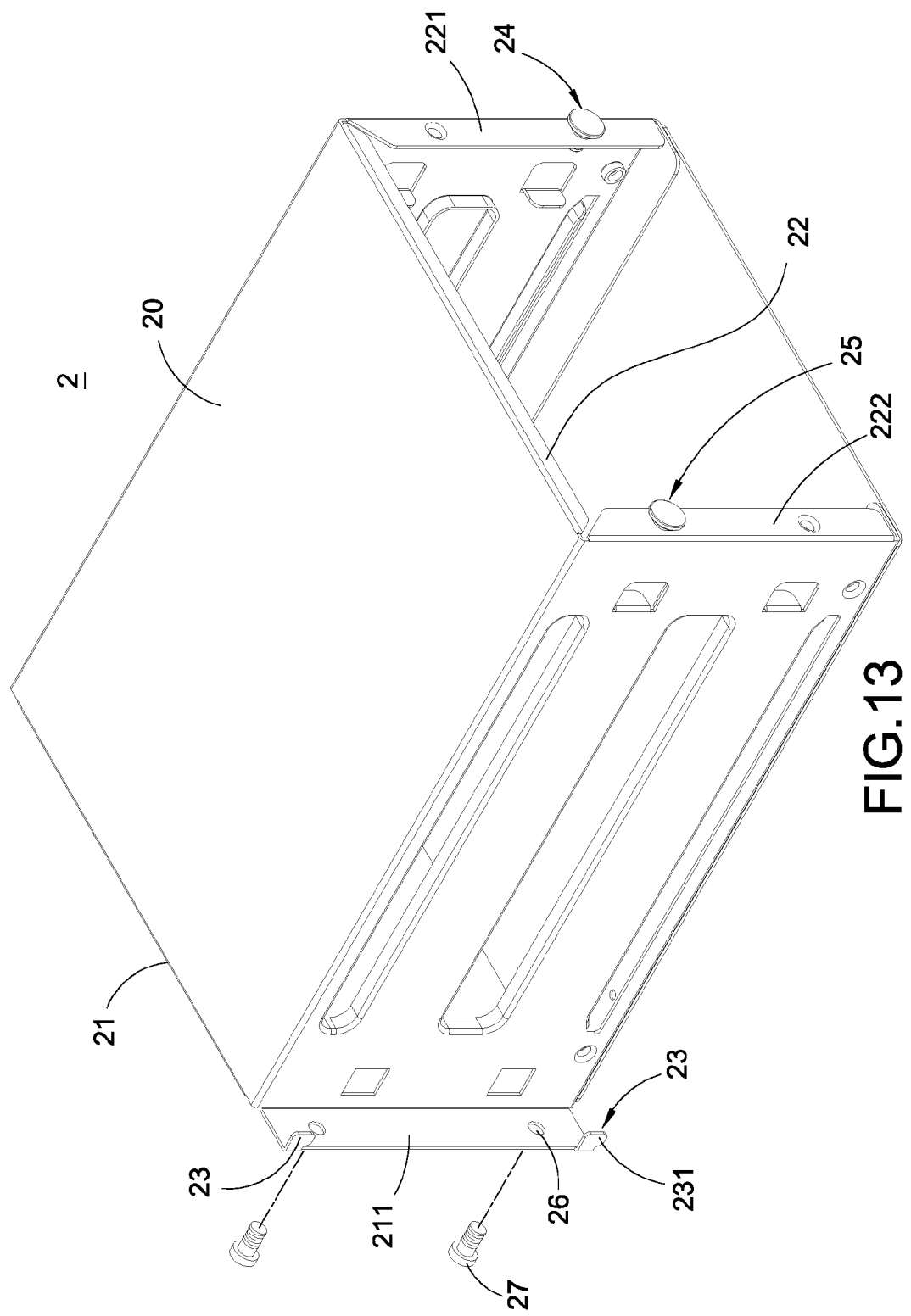
FIG. 13 is a perspective view of the supporting rack in the mainframe compute according to the fourth embodiment of the present invention.
Figure 14:
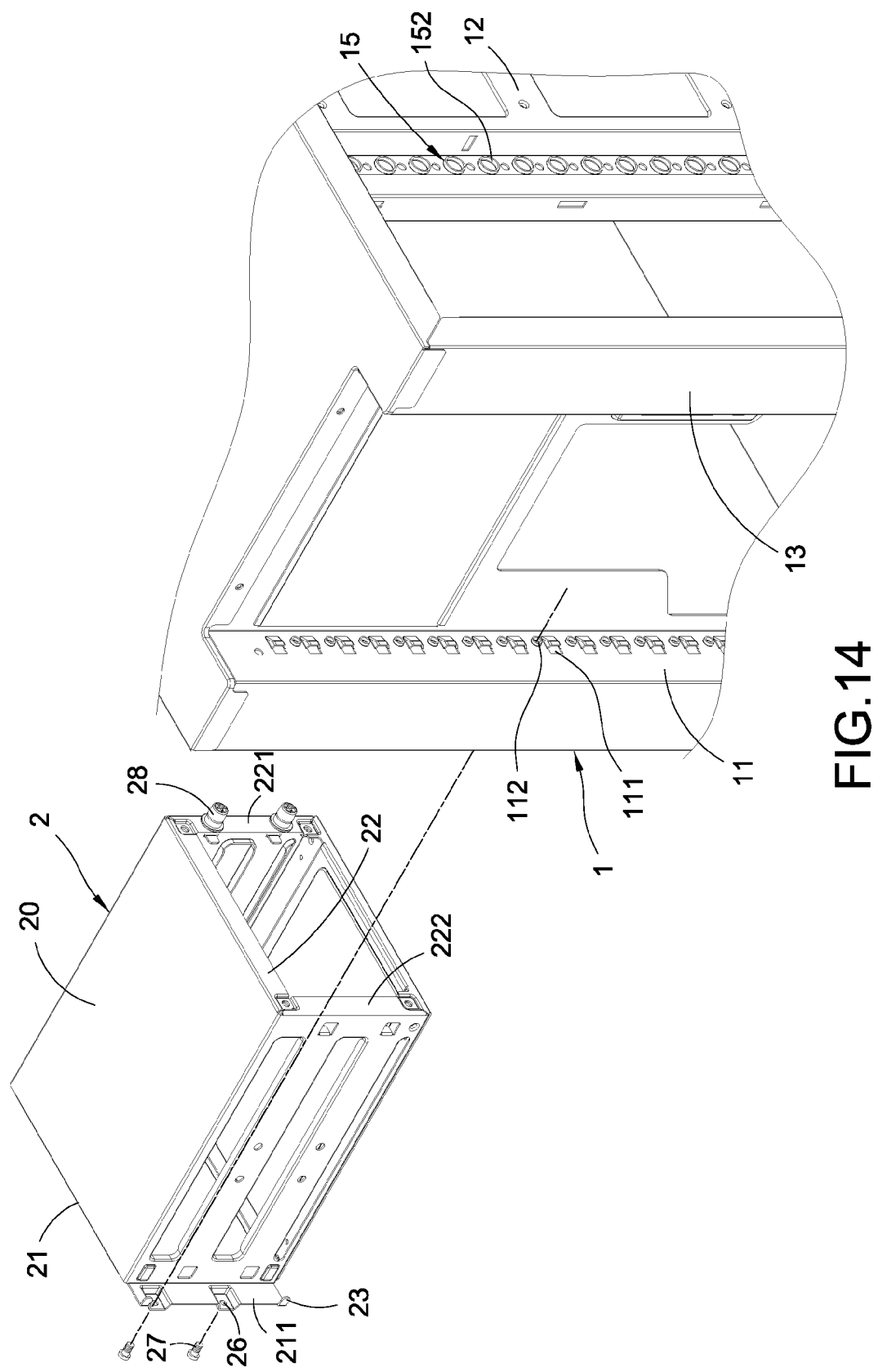
FIG. 14 is a perspective view of the mainframe compute according to a fifth embodiment of the present invention before the installation of the supporting rack.
Figure 15:
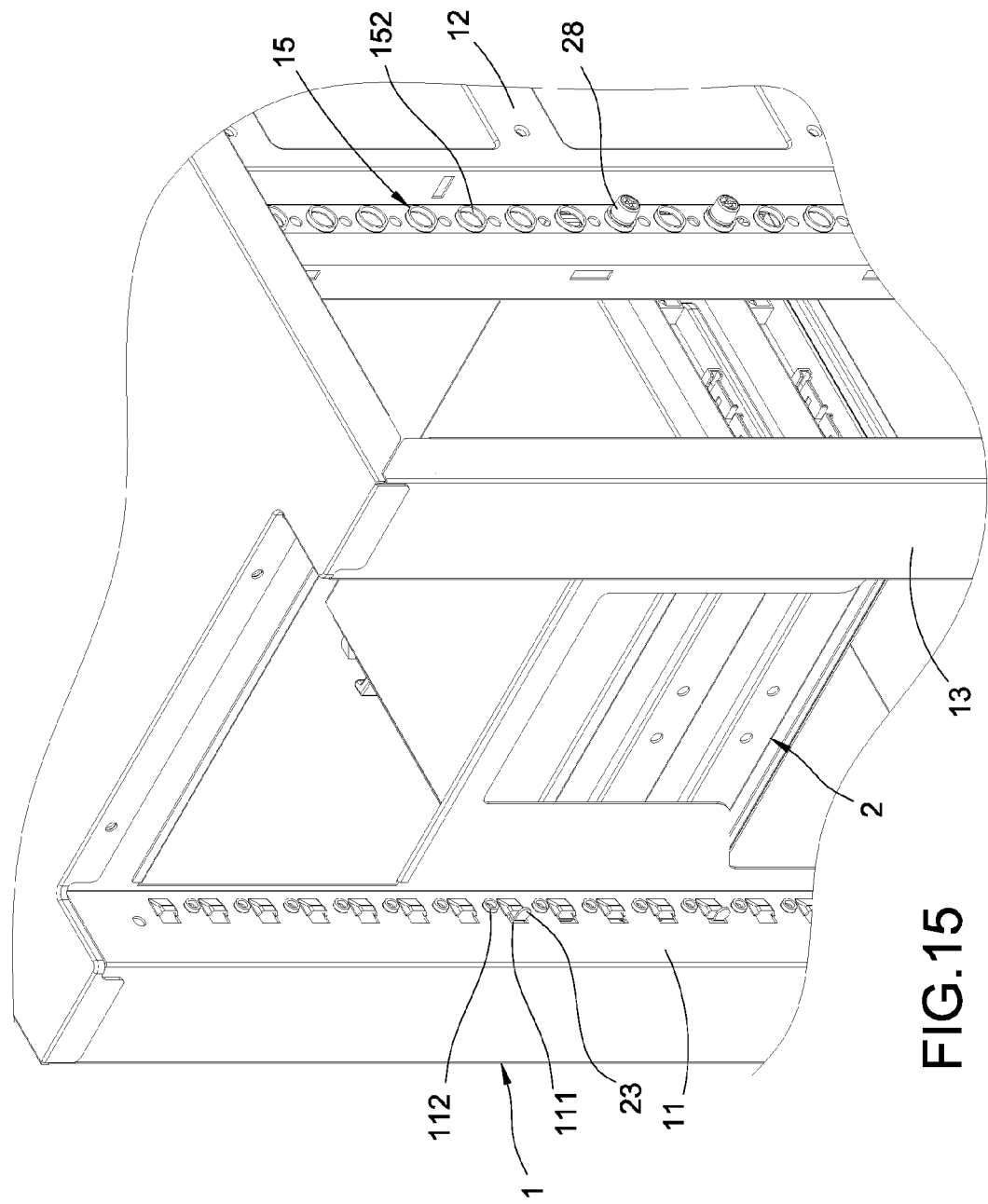
FIG. 15 is a perspective view of the present invention according to FIG. 14 after the installation of the supporting rack.
Figure 16:
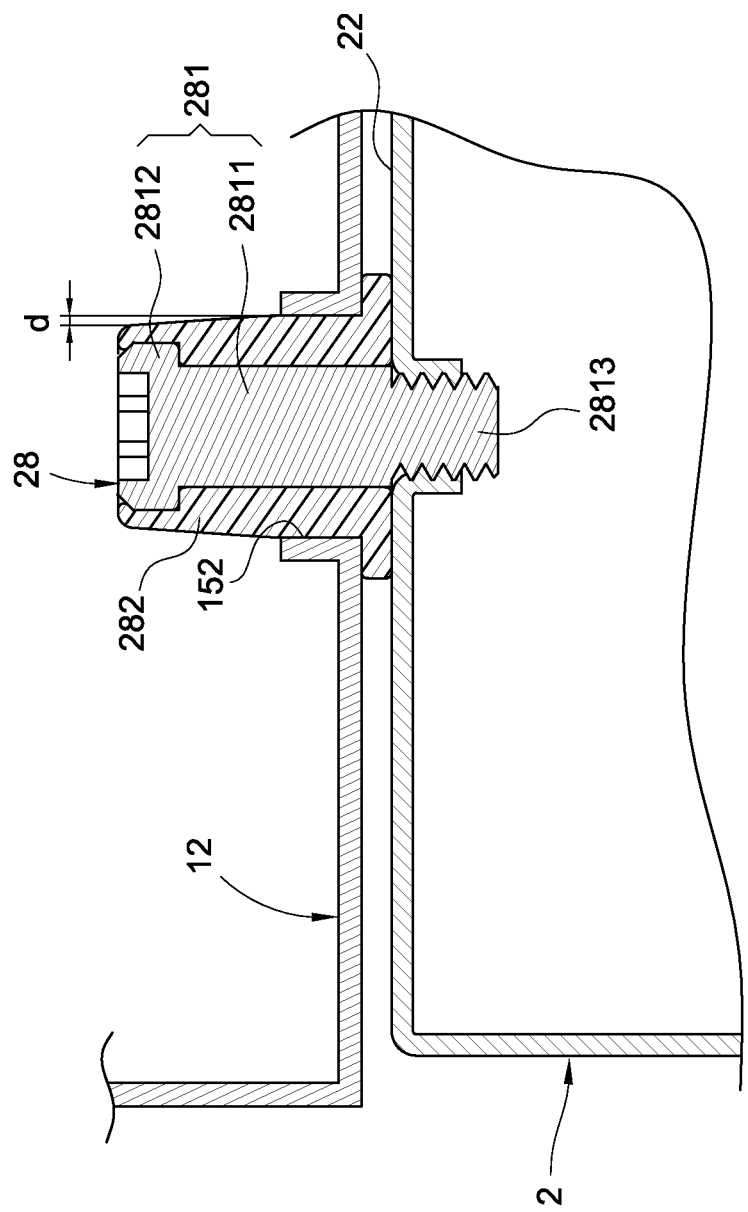
FIG. 16 is a partial cross sectional view of the present invention according to FIG. 15.

The present invention provides a mainframe computer with a supporting rack. FIG. 1 and FIG. 2 show a first embodiment of the present invention, FIG. 3 and FIG. 4 show a second embodiment of the present invention, FIGS. 5~11 show a third embodiment of the present invention, FIGS. 12 and 13 show a fourth embodiment, and FIGS. 14~16 show a fifth embodiment of the present invention.

Figure 17:
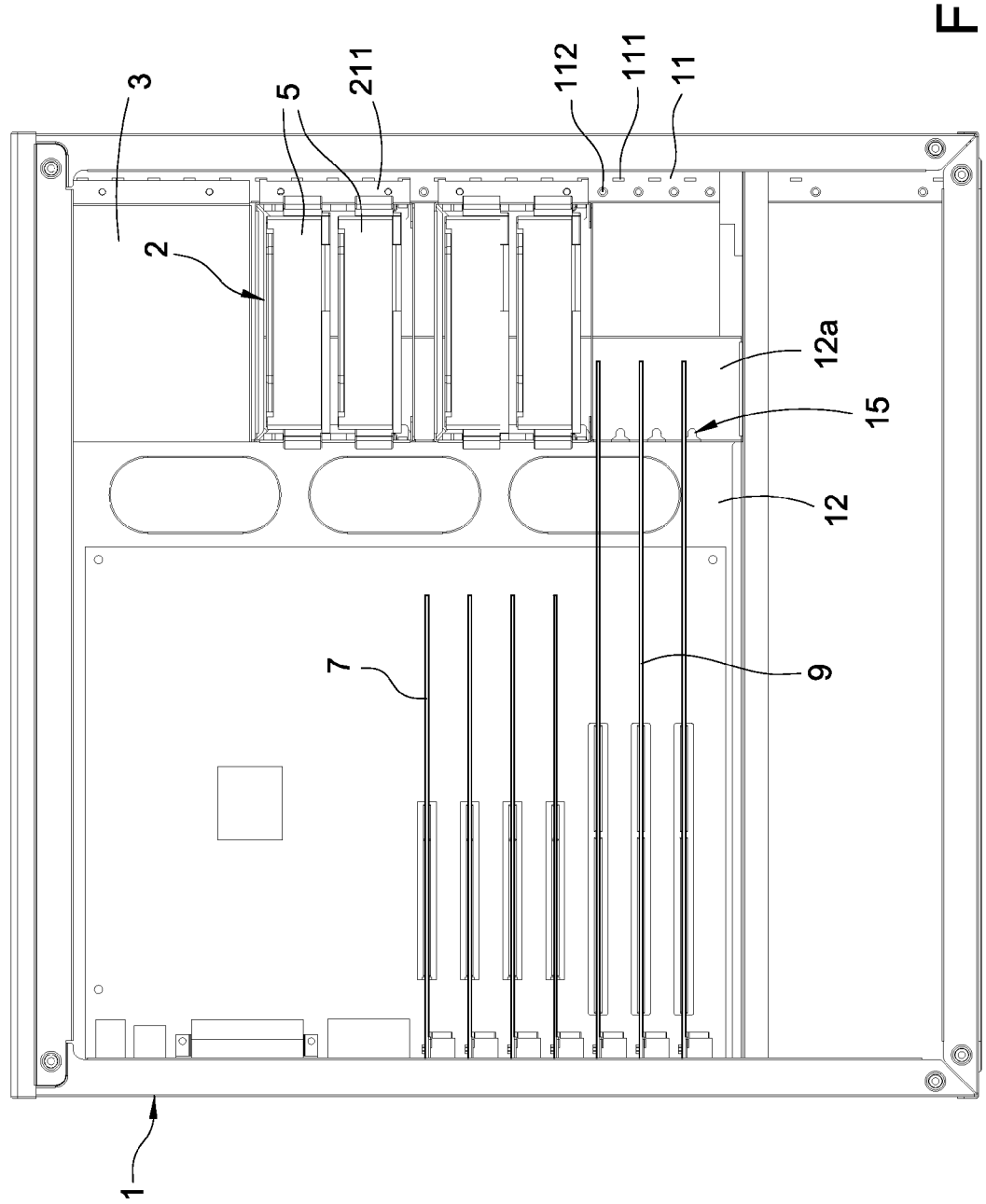
FIG. 17 is a side view of the mainframe computer of the present invention after performing the space adjustment.

FIG. 17 is an illustration showing the third, fourth and fifth embodiments of the present invention that can be adjusted for space therein.

In each one of the embodiments of the present invention, the supporting rack 2, 2a is arranged at any arbitrary position of the rack chassis 1, and the specific positions of the arrangements are described in detailed along with the each one of the embodiments in the following. In addition, the supporting rack 2, 2a can be used for supporting any objects, such as a solid state disk or a solid state drive (known as SSD), cooling liquid tank for cooling, hard drive or optical drive and so on; the present invention is not limited to any type of specific objects, and the following uses each one of the embodiments for illustration.

As shown in FIG. 1 and FIG. 2, a mainframe computer according to a first embodiment of the present invention comprises: a rack chassis 1 and a supporting rack 2a. The rack chassis 1 is a mainframe chassis of the mainframe computer, the supporting rack 2a is arranged on the rack chassis 1. In this embodiment, the supporting rack 2a can be detachably arranged on the rack chassis 1.

The rack chassis 1 includes a first rack 12, the first rack 12 includes a plurality of first positioning members 152. Each of the first positioning members 152 can be arbitrarily arranged or systematically aligned. In this embodiment, the first positioning members 152 are aligned into a first positioning member row 15 by way of an example for illustration purposes.

The supporting rack 2a includes at least one first corresponding positioning member 28 positioned corresponding to any one of the at least one first positioning member 152; in other words, the first positioning member 152 and the first corresponding positioning member 28 can be positioned corresponding to each other. In addition, the quantity of the first corresponding positioning member 28 can be one, two or more than two, and the present invention is not limited to any quantity; however, in this embodiment, a quantity of two members are used as an example for illustration purposes.

Wherein the first positioning member 152 and the first corresponding positioning member 28 can be of the configuration of a hole and a protruding column for insertion onto each other correspondingly, and they are not limited in any way as to which one must be the hole or the protruding column; however, in this embodiment, the first positioning member 152 is the hole and the first corresponding positioning member 28 is the protruding column as an example for illustration purposes.

Accordingly, the two first corresponding positioning members 28 of the supporting rack 28 can be inserted into any positions corresponding to the two first positioning members 152 on the first rack 12 in order to be positioned therein and to allow the object (such as the cooling liquid tank 6 as shown in FIG. 1 but the present invention is not limited to such object only) supported on the supporting rack 2a to be positioned on the first rack 12 of the rack chassis 1.

The aforementioned first corresponding member 28 can be any type of structure that is capable of being inserted onto the first positioning member 152 correspondingly in order to be positioned thereon, and in this embodiment, the later structure is used as an example for illustration purposes (please also refer to FIG. 12): the first corresponding positioning member 28 comprises a positioning shaft 281 and a rubber sleeve 282 surrounding the positioning shaft 281, one end of the positioning shaft 281 is connected to the supporting rack 2a (such as via an integral connection, soldering or screw fastening connection). Accordingly, when the first corresponding positioning member 28 is inserted into the position corresponding to the first positioning member 152, the outer edge of the rubber sleeve 282 contacts with the inner edge at a position corresponding to the first positioning member 152 (hole) with an interference such that it is positioned therein.

Furthermore, the positioning shaft 281 includes one end and another end facing toward each other. One end of the positioning shaft 281 is connected to the supporting rack 2a, as shown in FIG. 12, the outer diameter of the rubber sleeve 282 gradually decreases from one end of the positioning shaft 281 toward a direction of the another end thereof in order to allow the first corresponding positioning member 28 to be inserted onto the first positioning member 152 without any precise alignment. In addition, since a deeper insertion would cause the inner edge of the rubber sleeve 282 to be further pressed against the position corresponding to the first positioning member 152 (hole), a greater effect of positioning can be achieved such that in situation where the rack chassis 1 is tilted or tipped over, the supporting rack 2a would not be disengaged easily.

As shown in FIG. 3 and FIG. 4, the mainframe computer according to a second embodiment of the present invention is generally identical to the aforementioned first embodiment, and the difference relies in that the structure of the first corresponding positioning member 29 is different from the aforementioned first corresponding positioning member 28 and the structure of the first positioning member 152 is also different. Please refer to the following for further details.

The first positioning member 152 comprises an opening hole 1523 and a neck contracting slot 1524 which is connected to the opening hole 1523 and contracted corresponding to the inner diameter of the opening hole 1523. The first corresponding positioning member 29 comprises a shaft member 291 and a ring groove 292 formed at the outer edge of the shaft member 291. The shaft member 291 can be any type of shaft member, and in this embodiment, the shaft member 291 refers to the aforementioned positioning shaft 281 with the rubber sleeve 282 surrounding the positioning shaft 281 as an example for illustration purposes.

Accordingly, the first corresponding positioning member 29 is inserted into a position corresponding to the opening hole 1523 of the first positioning member 152, followed by moving the first corresponding positioning member 29 toward an internal direction of the slot of the neck contracting slot 1524 in order to allow the portion of the first rack 12 corresponding to the inner edge 1525 of the neck contracting slot 1524 to be inserted into a position corresponding to the ring groove 292; in other words, the first corresponding positioning member 29 can be restricted by the neck contracting slot 1524 of the first positioning member 152 via the ring groove 292. Therefore, the first corresponding positioning member 29 (second embodiment) is of a greater positioning effect in comparison to that of the aforementioned corresponding positioning member 28 (first embodiment).

In the aforementioned first embodiment and second embodiment, the two corresponding positioning members connected to the supporting rack 2a can be two identical first corresponding positioning members 28 (as shown in FIG. 2) or can be two first corresponding positioning members 29 (not shown in the figures); they can certainly be a first corresponding positioning member 28 and a first corresponding positioning member 29 that are different from each other (as shown in FIG. 3), and the present invention is not limited to any particular configurations.

As shown in FIG. 5~FIG. 11, the mainframe computer according to a third embodiment of the present invention comprises: a rack chassis 1 and a supporting rack 2; in fact, (along with the aforementioned first and second embodiments), the mainframe computer further comprises an optical drive rack 3, a hard drive 5, an optical drive (not shown in the figures), a mainboard (not labeled with a component sing) and a plurality of interface cards 7 electrically inserted into the mainboard and so on.

The rack chassis 1 can be a polygonal bracket formed by a plurality of bracket members, and it includes a first rack 12 and a second rack 11. The first rack 12 and the second rack 11 can be connected to any two bracket members of the polygonal bracket respectively, and in this embodiment, a left bracket member and a right bracket member facing toward each other in the polygonal bracket are used as an example for illustration purposes. In addition, the polygonal bracket further includes a front bracket member 13 (please see FIG. 6 or FIG. 8) and a rear bracket member 14 as well as an upper bracket member and a lower bracket member shown without the label of the component signs in the drawings.

The second rack 11 includes a plurality of second positioning members 111. As for the first rack 12, it includes a plurality of first positioning members 151 (identical to the first positioning member 152 in the first embodiment) such that it is identical to that of the aforementioned first embodiment. In addition, each of the first positioning members 151 can also be aligned into at least one first positioning member row 15.

The supporting rack 2 is arranged on the first rack 12 and the second rack 11 of the rack chassis 1; in this embodiment, it is detachably arranged on the first rack 12 and the second rack 11. Furthermore, the position of the supporting rack 2 arranged on the rack chassis 1 is not limited; for example, the position of a corner inside the rack chassis 1 can be an exemplary position.

The supporting rack 2 includes a first side 22 and a second side 21. The first side 22 and the second side 21 can be any two sides of the supporting rack 2. In this embodiment, two sides of the supporting rack 2 facing toward each other are used as an example for illustration purposes.

The second side 21 includes at least one second corresponding positioning member 23, the first side 22 includes at least one first corresponding positioning member 24, and in this embodiment, the latter is used as an example for illustration purposes: the second side 21 includes two second corresponding positioning members 23 positioned corresponding to the positions of any two of the second positioning members 111, and the first side 22 includes two first corresponding positioning members 24 positioned corresponding to the positions of any two of the first positioning members 151. Certainly, the quantity of the second corresponding positioning member 23 and the quantity of the first corresponding positioning member 24 can also be more than two respectively, and the present invention is not limited to any particular quantity. Furthermore, the second side 21 of the supporting rack 2 can further include a side wing 211, and the second corresponding positioning member 23 is arranged on the side wing 211. It shall be noted that the present invention is not limited to the configuration that the supporting rack 2 must include the side wing 211 formed thereon.

Similar to the aforementioned first embodiment, the first positioning member 151 and the first corresponding positioning member 24 in a third embodiment of the present invention can be of the configurations of a hole and a protruding column for inserting onto each other correspondingly, and they are not limited as to which one must be the hole or the protruding column. In this embodiment, the configuration in which the first positioning member 151 is a hole and the first corresponding positioning member 24 is a protruding column is used as an example for illustration purposes.

The second positioning member 111 and the second corresponding positioning member 23 in the third embodiment can be of the configurations of an insertion hole and an insertion member for positioning onto each other correspondingly, and they are not limited as to which one must be the insertion hole or the insertion member. In this embodiment, the configuration in which the second positioning member 111 is the insertion hole and the second corresponding positioning member 23 is the insertion member is used as an example for illustration purposes only.

The second rack 11 can further include a plurality of screw holes 112, and the side wing 211 of the supporting rack 2 can further include a plurality of holes 26 formed at positions corresponding to each one of the screw holes 112 in order to allow a plurality of a screw fastening members 27 to fasten between the corresponding holes 26 and the screw holes 112 respectively such that the supporting rack 2 can be more firmly secured onto the rack chassis 1. The hole 26 in this embodiment can be a screw hole or a conventional through hole.

Figure 6:
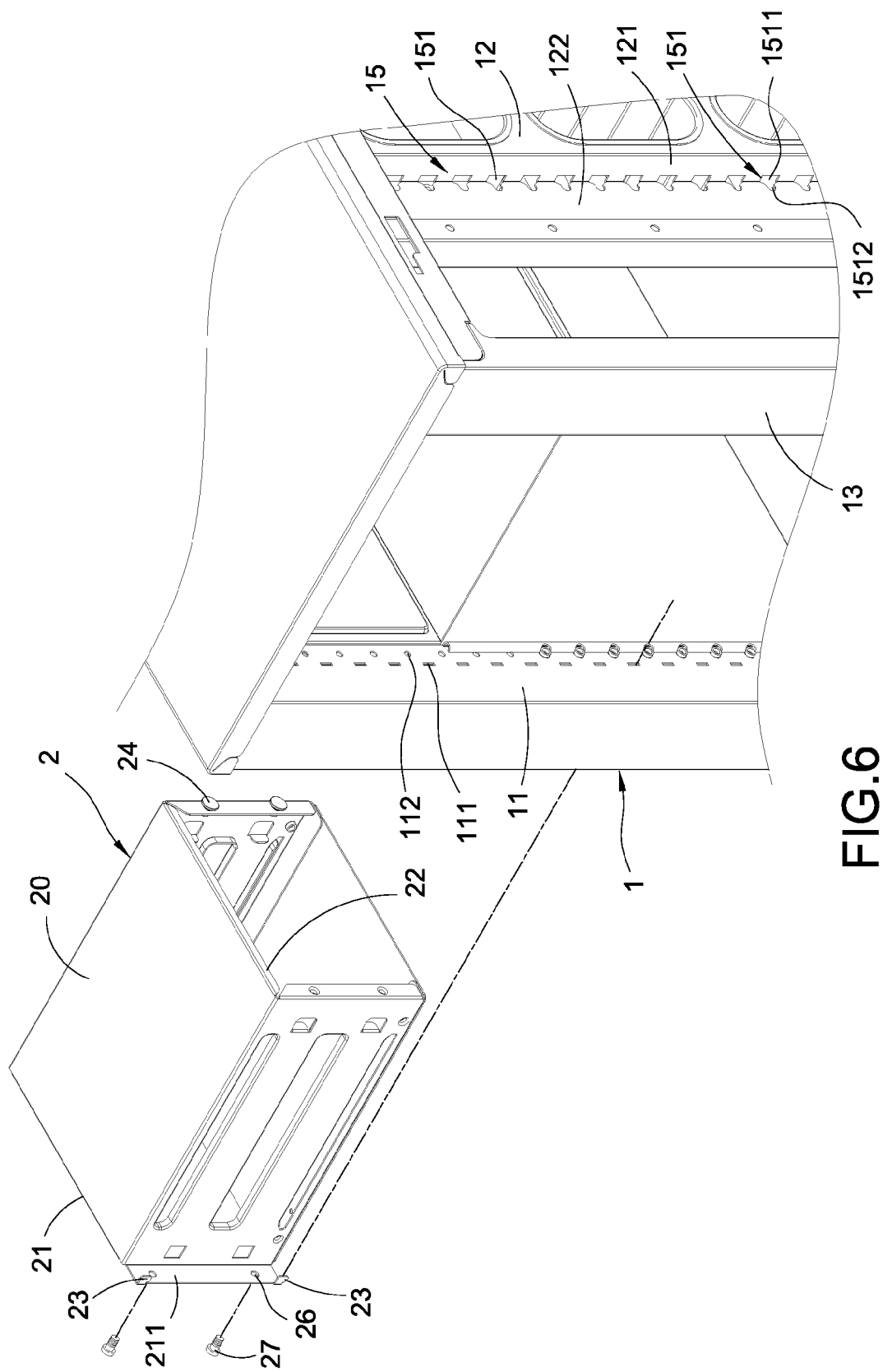
FIG. 6 is a perspective view of the mainframe compute according to the third embodiment of the present invention before the installation of the supporting rack.
Figure 7:
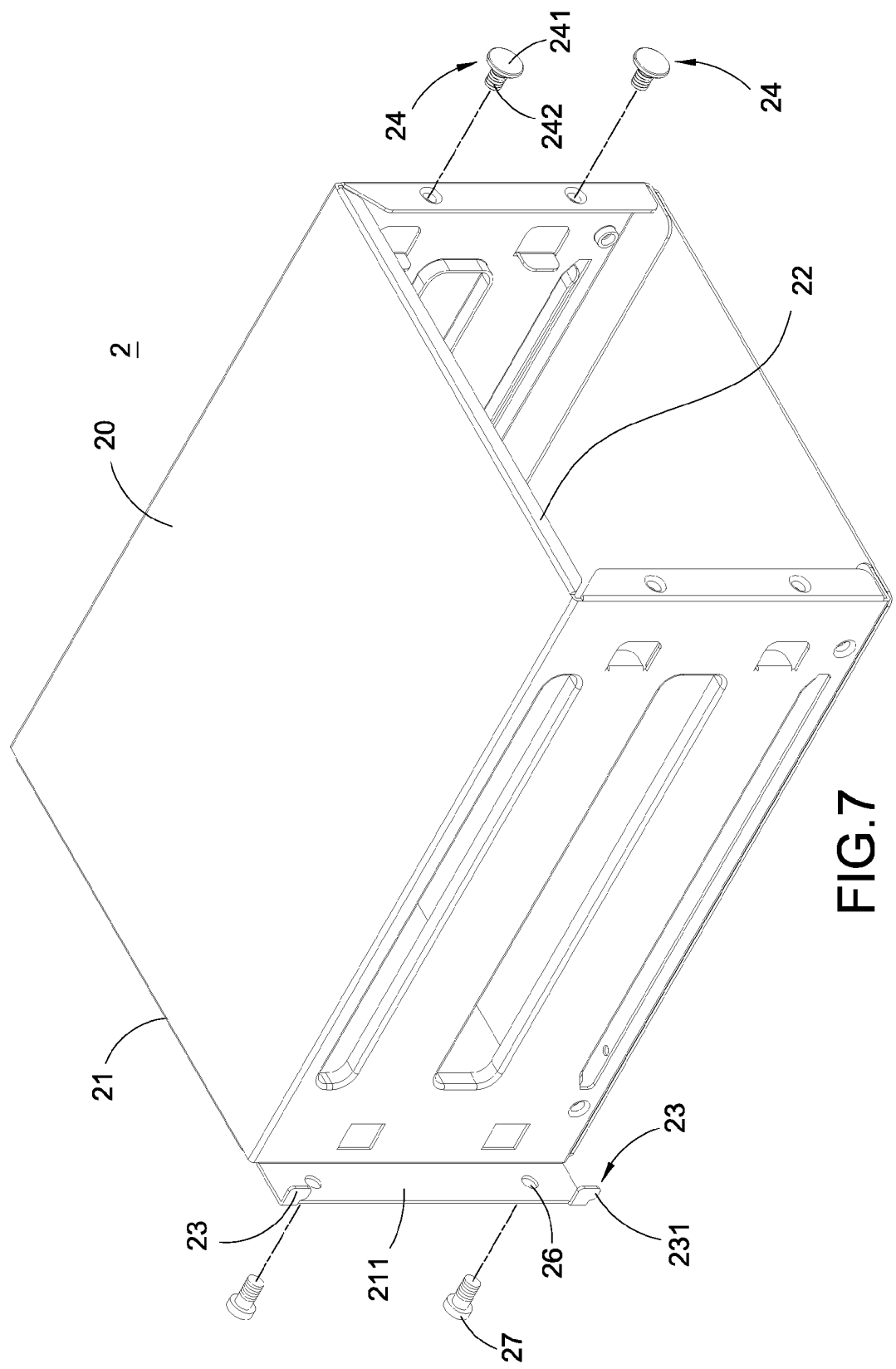
FIG. 7 is a perspective view of the supporting rack in the mainframe compute according to the third embodiment of the present invention.
Figure 8:
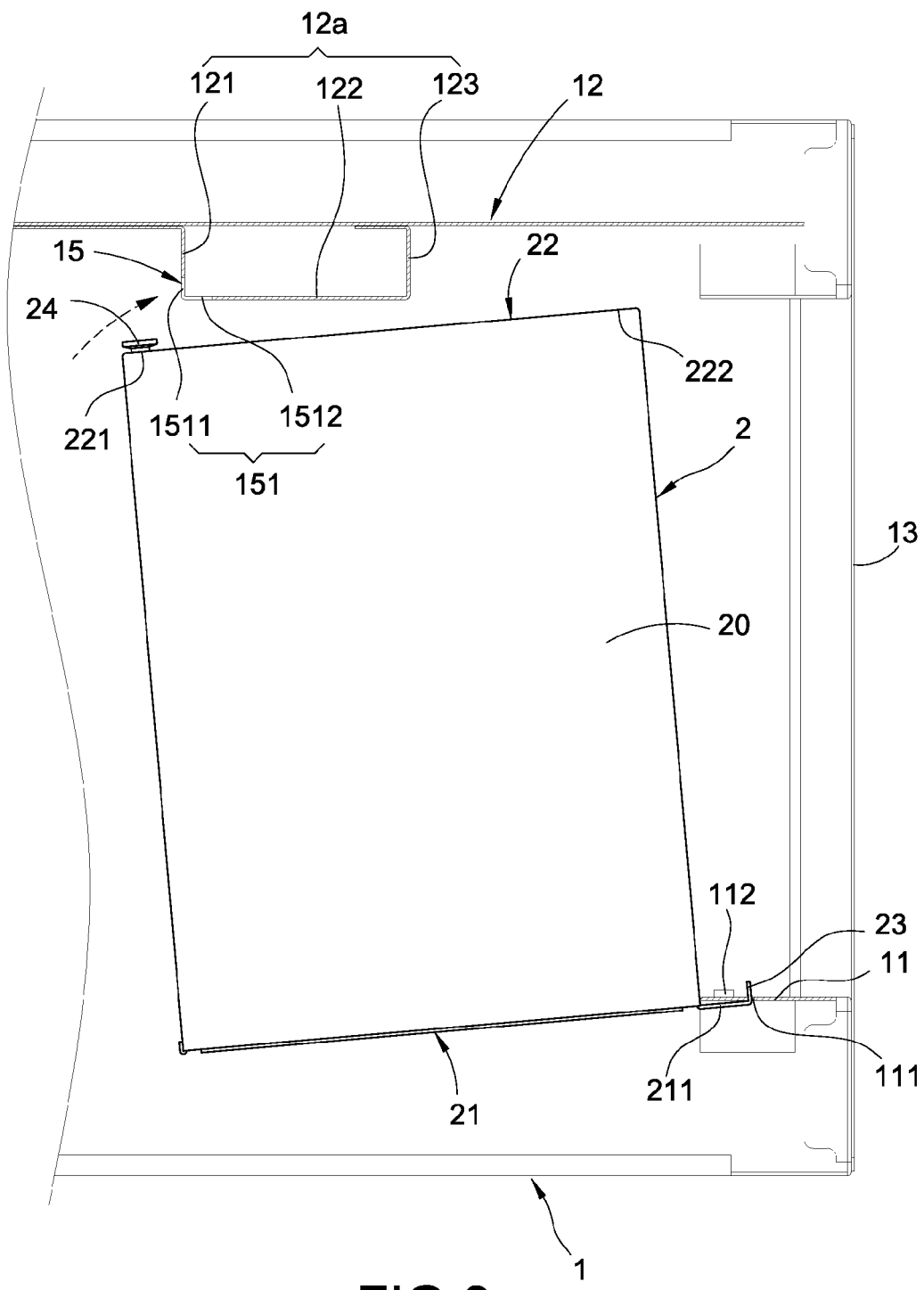
FIG. 8 is a top view of the mainframe compute according to the third embodiment of the present invention before the installation of the supporting rack.

To be more specific, as shown in FIG. 7 and FIG. 8, the first side 22 of the supporting rack 2 includes a first end 221 and a second end 222 facing toward each other, and the aforementioned first corresponding positioning member 24 is arranged on the first side 22 adjacent to the first end 221. In addition, the positions of the second corresponding positioning member 23 and the hole 26 arranged on the supporting rack 2 are obliquely facing toward the positions of the first corresponding positioning member 24 arranged on the supporting rack 2 (as shown in FIG. 8). Additionally, the supporting rack 2 includes the aforementioned first side 22 and the second side 21, it further includes a third side 20 connected between the first side 22 and the second side 21. In this embodiment, the first corresponding positioning member 24 is arranged on the first side 22, the second corresponding positioning member 23 (together with the hole 26) is arranged on the second side 21. The positions of the first corresponding positioning member 24 and the second corresponding positioning member 23 (together with the hole 26) are arranged in a direction obliquely facing toward each other on the third side 20 (as shown in FIG. 8). The quantities of the first corresponding positioning members 24 and second corresponding positioning members 23, respectively, can be one, two or more than two, and the present invention is not limited to any quantities. For example, the first and second corresponding positioning members 24, 23 in the third embodiment are of the quantities of two members (as shown in FIGS. 6 and 7).

The second positioning member 111 is a linear insertion hole of an I shape, and the second corresponding positioning member 23 is a protruding ear for inserting into a position corresponding to the insertion hole. In addition, a lower edge adjacent to a free end of the protruding ear includes a hook portion 231 protruded therefrom. Therefore, as shown in FIG. 11, when the second corresponding positioning member 23 (protruding ear) is inserted into the position corresponding to the second positioning member 111 (insertion hole), the hook portion 231 of the second corresponding positioning member 23 is able to reversely hooked onto the inner surface of the second rack 11 in order to allow the supporting rack 2 to be hooked onto the second rack 11 despite that only the second corresponding positioning member 23 of the second side 21 is inserted therein (at this time, the first corresponding positioning member 24 of the first side 22 is not yet positioned onto the first rack 12); in addition, due to the effect of reverse hooking by the hook portion 231, the supporting rack 2 is able to use one end of the second side 21 to hook onto the second rack 11 of the rack chassis 1 such that when the first corresponding positioning member 24 is positioned onto the first rack 12, the user is not required to use the hand to manually hold the supporting rack 2 and the effect of facilitated assembly can be achieved.

Figure 10:
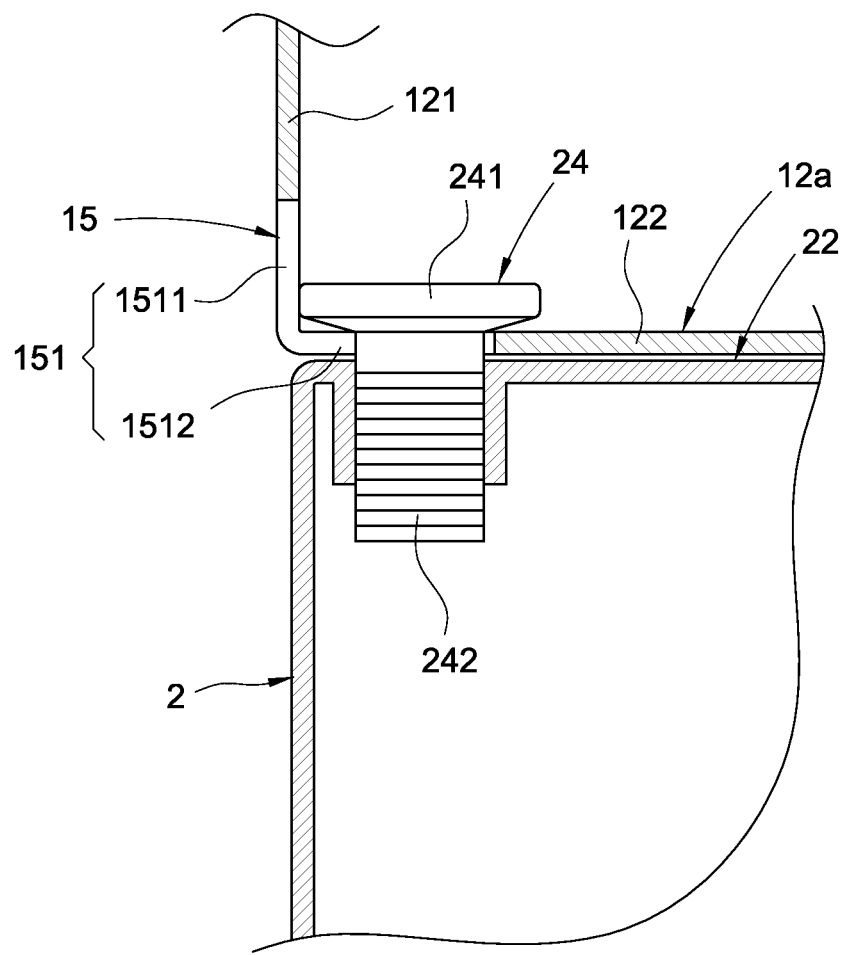
FIG. 10 is a partial cross sectional view of the present invention according to FIG. 9.

Please refer further to FIG. 8 and FIG. 10. The first rack 12 includes a first column member 12a. The first column member 12a comprises a first plate 121, a third plate 123 and a second plate 122 connected between the first plate 121 and the third plate 123. Wherein, one ends of the first plate 121 and the second plate 122 are connected with each other to form a bending shape, and another end of the second plate 122 and one end of the third plate 123 are also connected with each other to form a bending shape.

The aforementioned first positioning member row 15 is formed between the first plate 121 and the second plate 122 of the first column member 12a. Each of the first positioning members 151 of the first positioning member row 15 comprises an opening 1511 and a notch 1512 connected to each other. Wherein, the opening 1511 is formed on the first plate 121 adjacent to the second plate 122, and the notch 1512 is formed on the second plate 122 adjacent to the first plate 121.

As shown in FIG. 7, FIG. 8, FIG. 9, FIG. 10 and FIG. 11, the first corresponding positioning member 24 comprises a shaft portion 242 and a cap portion 241 connected to one end of the shaft portion 242, and another end of the shaft portion 242 is connected to the first side 22 of the supporting rack 2. The present invention is not limited to any manner of connecting the shaft portion 242 to the first side 22, which can be an insertion connection, a riveting connection or a screw fastening connection. In this embodiment, the screw fastening connection is used as an example for illustration purposes; accordingly, the shaft portion 242 refers to a screw shaft in this embodiment.

Wherein the opening diameter dimensions of the opening 1511, cap portion 241, notch 1512 and shaft portion 242 are: inner diameter of the opening 1511>outer diameter of the cap portion 241>inner diameter of the notch 1512>outer diameter of the shaft portion 242. Therefore, the cap portion 241 is allowed to pass through the position corresponding to the opening 1511, the shaft portion 242 is able to enter into the position corresponding to the notch 1512. As shown in FIG. 10, at this time, the side of the cap portion 241 connected to the shaft portion 242 is formed to be of an inverted hook shape at a position corresponding to the notch 1512 adjacent (or next to) to the second plate 122 in order to allow the supporting rack 2 to be more firmly positioned onto the rack chassis 1.

Figure 9:
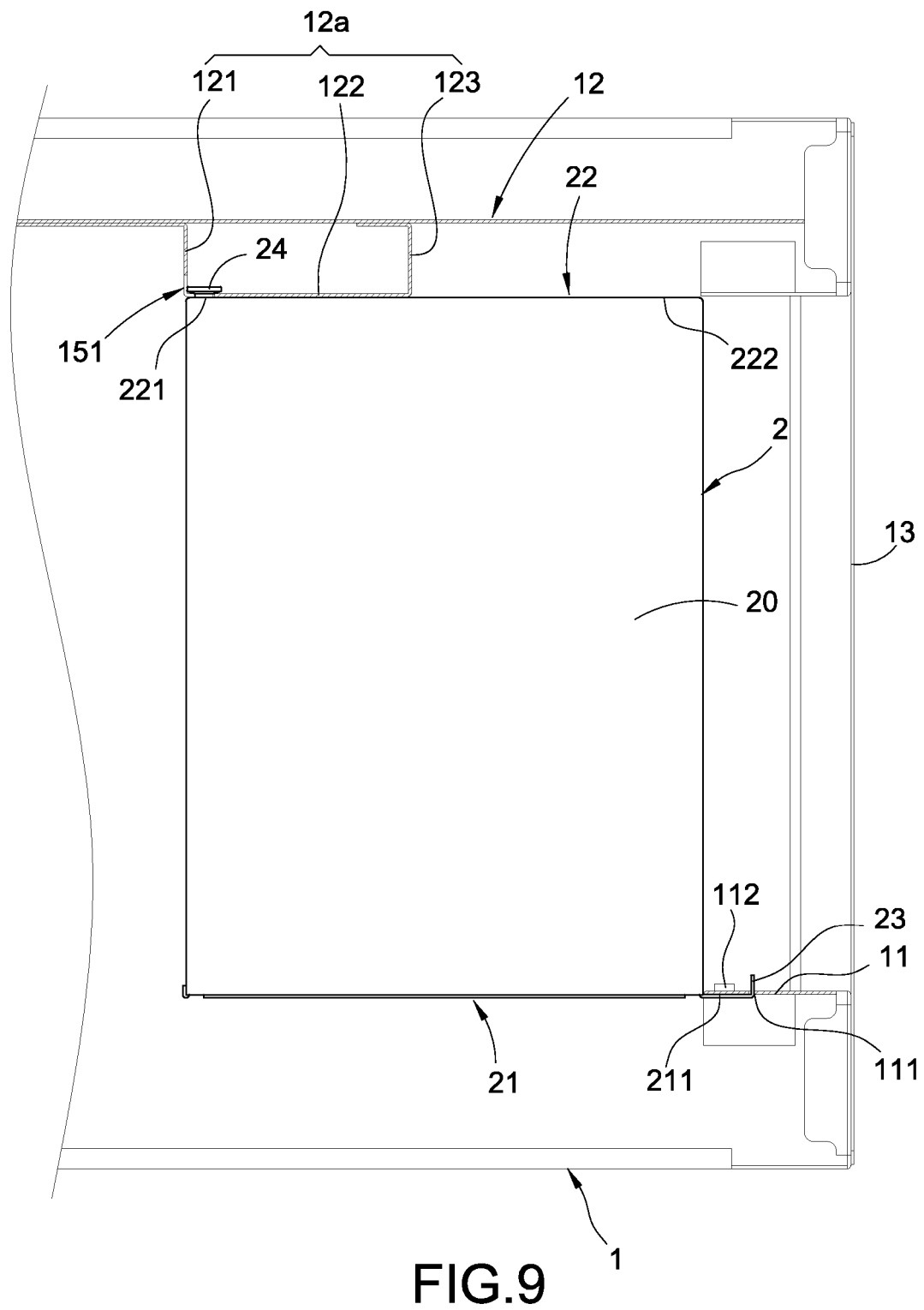
FIG. 9 is a top view of the present invention according to FIG. 8 after the installation of the supporting rack.

Accordingly, during the assembly of the supporting rack 2 in the third embodiment of the present invention, first, the second corresponding positioning member 23 of the second side 21 is correspondingly inserted into the second positioning member 111 of the second rack 11, so as to make the supporting rack 2 to use one end of the second side 21 to hook onto the rack chassis 1 without the need for holding it manually by hand. Next, the supporting rack 2 uses such hooking area as an axis to rotate the first corresponding positioning member 24 toward the direction of the first positioning member 151 (as shown in FIG. 8) in order to allow the first corresponding positioning member 24 could enter into the position corresponding to the first positioning member 151 and the cap portion 241 would be reversely hooked onto the second plate 122 at the position corresponding to the notch 1512 and to be positioned thereon (as shown in FIG. 9), therefore, the supporting rack 2 is positioned onto the rack chassis 1. Certainly, screw fastening members 27 can be further used for fastening between the hole 26 and the screw hole 112 correspondingly; therefore, the supporting rack 2 can be more firmly secured onto the rack chassis 1.

Certainly, for the removal of the supporting rack 2 already installed, the screw fastening members 27 can be simply removed first, followed by reversely rotating the supporting rack 2 with the hooking area of the supporting rack 2 as the rotational axis, such that the first corresponding positioning member 24 can be disengaged from the first positioning member 151. Finally, the two corresponding positioning members 23 can be disengaged from the second positioning members 111 in a reverse direction in order to completely remove the supporting rack 2 from the rack chassis 1.

FIG. 12 and FIG. 13 show a fourth embodiment of the present invention. The fourth embodiment of the present invention is generally identical to the third embodiment, and the difference relies in that it further includes another first corresponding positioning member 25 identical to the aforementioned first corresponding positioning member 24 while each of the first positioning members 151 is aligned into two first positioning member rows 15, 16. Please refer to the following for further details.

The first rack 12 of the rack chassis 1 further includes a second column member 12b identical to the aforementioned first column member 12a. Therefore, the second column member 12b also includes another first positioning member row 16 identical to the aforementioned first positioning member row 15. Wherein, the another first positioning member row 16 also comprises a plurality of first positioning members 151.

As for the supporting rack 2, it includes at least another first corresponding positioning member 25 identical to the aforementioned first corresponding positioning member 24 and arranged on the first side 22 adjacent to the second end 222 such that during the assembly of the supporting rack 2, the two first corresponding positioning members 24, 25 can be respectively positioned onto the positions corresponding to the first positioning members 151 of the two first positioning member rows 15, 16 at the same time. Therefore, it is of a greater stability than that of the first embodiment.

For the quantities of the arrangement of the first corresponding positioning members 24 and the another first corresponding positioning member 25, one (as shown in FIG. 13) or a plurality of (not shown in the figures) the first corresponding positioning members 24 can be arranged on the first side 22 adjacent to the first end 221, and one (as shown in FIG. 13) or a plurality of (not shown in the figures) the another first corresponding positioning member 25 can be arranged on the first side 22 adjacent to the second end 222. The present invention is not limited to any particular quantities. Wherein, when the quantity of arrangement is one for each, the positions of the first corresponding positioning member 24 and the another first corresponding positioning member 25 on the first side 22 are arrange to obliquely face toward each other (as shown in FIG. 13) in order to obtain a greater stability. Alternatively, there can be a plurality (such as two or more than two) of the first corresponding positioning members 24 and/or the another first corresponding positioning members 25.

FIG. 14, FIG. 15 and FIG. 16 show a fifth embodiment of the present invention. The fifth embodiment is generally identical to the aforementioned third embodiment, and the difference relies in that the structure of the first corresponding positioning member is different, and the first positioning member formed on the first rack 12 is also different. Please refer to the following for further details.

The first corresponding positioning member 28 in the fifth embodiment comprises a positioning shaft 281 and a rubber sleeve 282 surrounding the positioning shaft 281, and one end of the positioning shaft 281 is connected to the first side 22 of the supporting rack 2. In this embodiment, the configuration in which the positioning shaft 281 comprises a shaft portion 2811, a cap portion 2812 connected to one end of the shaft portion 2811 and a threaded section 2813 connected to another end of the shaft portion 2812 is used as an example for illustration purposes. Accordingly, the positioning shaft 281 can use its threaded section 2813 for fastening onto the first side 22 and use the cap portion 2812 and the rubber sleeve 282 to generate interference. The first positioning member 152 is a through hole (as shown in FIG. 14) corresponding to the first corresponding positioning member 28.

As a result, the first corresponding positioning member 28 is able to directly insert into the position corresponding to the first positioning member 152 of the through-hole type, and at this time, the outer edge of the rubber sleeve 282 contacts with the inner edge of the position corresponding to the first positioning member 152 to generate interference such that the effect of shock absorbing and firm insertion therebetween can achieved.

In addition, since the first corresponding positioning member 28 is able to directly insert into the position corresponding to the first positioning member 152, the supporting rack 2 can be positioned onto the rack chassis 1 with a generally linear moveable method such that it does not require the rotation of the aforementioned third embodiment or the fourth embodiment for the positioning thereof, which makes its assembly to be more convenient than those of the third embodiment and the fourth embodiment. Also, during the positioning, it allows the second corresponding positioning member 23 to be inserted into the position corresponding to the second positioning member 111, and it also allows the first corresponding positioning member 28 to be inserted into the position corresponding to the first positioning member 152.

Furthermore, the outer diameter of the rubber sleeve 282 gradually decreases from the threaded section 2813 toward the direction of the cap portion 2812 such that an outer diameter differential distance d (as shown in FIG. 16) is generated between the largest outer diameter and the smallest outer diameter of the rubber sleeve 282. Therefore, it is of the effect of facilitated insertion of the first positioning member 152.

The supporting rack 2 can only be arranged with the first corresponding positioning member 28 on the first side 22 adjacent to the first end 221 (as shown in the figure), and the first rack 12 of the rack chassis 1 can be formed of the first positioning member row 15 comprising a plurality of first positioning members 152 (as show in the figure). Certainly, another first corresponding positioning member (not shown in the figure) identical to the first corresponding positioning member 28 can also be arranged on the first side 22 adjacent to the second end 222, and the first rack 12 can be further formed of another first positioning row (not shown in the figure) comprising a plurality of first positioning members; the present invention is not limited to such configurations only.

As shown in FIG. 17, with the supporting rack 2 provided in the aforementioned embodiments, it further includes at least the following effects:

The interface cards 7 shown in the aforementioned embodiments are all interface cards with a normal length such that they would not generate any interference with the supporting rack 2.

However, when the situation of an elongated interface card 9 is used and the interference with the supporting rack 2 occurs, it only requires that the position of the supporting rack 2 arranged on the rack chassis 1 to be adjusted in order to easily prevent the interference caused by the elongated interface card 9. Therefore, it is of the effect that the internal space of the rack chassis 1 is adjustable.

Furthermore, the optical drive rack 3 can also be removed, and the space after the removal of the optical drive rack 3 can be modified for the arrangement of the supporting rack 2 in order to increase the quantity of the installation of the hard drive 5. Therefore, it is of greater flexibility for usages.

In view of the above, the present invention is of the following effects in comparison to the prior arts: by using the supporting rack 2, 2a positioned onto the rack chassis 1, various types of objects (such as: solid state disk, cooling liquid tank for cooling, hard drive or optical drive and so on) can be easily and conveniently installed onto the mainframe computer.

Furthermore, the present invention is also of other effects, such like:

(1) With the hook portion 231 of the second corresponding positioning member 23, it can be reversely hooked onto the second rack 11 in order to prevent the supporting rack 2 from falling off, and the user is not required to hold the supporting rack 2 manually by hand; therefore, it is of the effect of facilitated assembly.

(2) With the rubber sleeve 282 surrounding the first corresponding positioning member 28, it is of the following two effects accordingly: A. the outer edge of the rubber sleeve 282 is able to contact with the inner edge at the position corresponding to the first positioning member 152 to generate interference such that it is of the effects of shock absorbing and firm insertion therebetween; B. since the first corresponding positioning member 28 is able to directly insert into the position corresponding to the first positioning member 152, the supporting rack 2 can be positioned onto the rack chassis 1 with a generally linear moveable method, allowing the assembly to be more direct and more convenient.

(3) With the second rack 11 and the first rack 12 of the rack chassis 1 being formed of a plurality of second positioning members 111 and a plurality of first positioning members 151 (152) thereon respectively, and with the second side 21 and the first side 22 of the supporting rack 2 being arranged with the second corresponding positioning member 23 and the first corresponding positioning member 24 (28) thereon respectively, the supporting rack 2 is allowed to be selectively positioned at any position on the rack chassis 1. Therefore, it is able to prevent the interference caused by the use of an elongated interface card 9 such that it is indeed of the effect that the internal space of the rack chassis 1 is adjustable.

(4) It also allows the optical drive rack 3 to be removed and to be modified for the installation of the supporting rack 2. Therefore, it provides a greater flexibility for usage.

In view of the above, it shall be noted that the above description provides preferred embodiments of the present invention only, which shall not be treated as limitation of the scope of the present invention. Any equivalent techniques and technical modifications based on the content of the specification and drawings of the present invention shall be deemed to be within the scope of the present invention.

What is claimed is:

1. A mainframe computer with a supporting rack, comprising:
   a rack chassis having a first rack and a second rack, the first rack having a plurality of first positioning members arranged thereon; the second rack having a plurality of second positioning members arranged thereon; and
   the supporting rack arranged on the rack chassis, the supporting rack having at least one first corresponding positioning member positioned corresponding to at least one of the plurality of first positioning members and at least one second corresponding positioning member positioned corresponding to at least one of the plurality of second positioning members,
   wherein the first positioning member and the first corresponding positioning member are a hole and a protruding column for inserting onto each other correspondingly;
   wherein the protruding column comprises a positioning shaft and a rubber sleeve surrounding the positioning shaft, one end of the positioning shaft is connected to the supporting rack, the protruding column is detachably inserted into a position corresponding to the hole, an outer edge of the rubber sleeve contacts with an inner edge corresponding to a position of the hole in order to be positioned therein with an interference.

2. The mainframe computer with a supporting rack according to claim 1, wherein the positioning shaft includes one end connected to the supporting rack and another end opposite from the one end, an outer diameter of the rubber sleeve gradually decreases from the one end of the positioning shaft toward a direction of the another end thereof.

3. The mainframe computer with a supporting rack according to claim 1, wherein the second positioning member and the second corresponding positioning member are an insertion hole and an insertion member for positioning onto each other correspondingly.

4. The mainframe computer with a supporting rack according to claim 3, wherein the insertion hole is a linear insertion hole of an I shape, the insertion member is a protruding ear for inserting into a position corresponding to any one of the insertion hole.

5. The mainframe computer with a supporting rack according to claim 4, wherein a lower edge adjacent to a free end of the protruding ear includes a hook portion protruded downward therefrom, the hook portion is hooked onto the second rack.

6. The mainframe computer with a supporting rack according to claim 1, wherein the second rack further includes a plurality of screw holes formed thereon, the supporting rack includes at least one hole formed corresponding to a position of any one of the at least one screw hole, a screw fastening member is fastened between the hole and the screw hole.

7. The mainframe computer with a supporting rack according to claim 1, wherein the supporting rack includes a first side and a second side, the first side includes the at least one first corresponding positioning member formed thereon, the second side includes a side wing, the side wing includes the at least one second corresponding positioning member formed thereon.

8. The mainframe computer with a supporting rack according to claim 1, wherein the first rack includes a column member, the column member includes the first positioning members as well as a first plate and a second plate connected to each other to form a bending shape, each one of the first positioning members comprises an opening formed on the first plate and a notch formed on the second plate and connected to the opening, the first corresponding positioning member of the supporting rack enters into the notch via the opening in order to be positioned therein.

9. The mainframe computer with a supporting rack according to claim 8, wherein the first corresponding positioning member comprises a shaft portion entering into a position corresponding to the notch and a cap portion passing through a position corresponding to the opening, the cap portion is connected to one end of the shaft portion, another end of the shaft portion is connected to the supporting rack, an outer diameter of the cap portion is greater than an inner diameter of the notch, one side of the cap portion connected to the shaft portion is formed of an inverted hook shape at a position corresponding to the notch and adjacent to the second plate.

10. The mainframe computer with a supporting rack according to claim 1, wherein each of the first positioning members of the rack chassis is aligned into at least one first positioning member row.

11. The mainframe computer with a supporting rack according to claim 1, wherein each of the first positioning members of the rack chassis is aligned into at least two first positioning member rows, the supporting rack includes at least two first corresponding positioning members aligned corresponding to the at least two first positioning member rows, two of the first corresponding members are positioned with any one of the first positioning member in the two first positioning member rows correspondingly.

12. The mainframe computer with a supporting rack according to claim 1, wherein each of the second positioning members of the rack chassis is aligned into at least one row.

13. The mainframe computer with a supporting rack according to claim 1, wherein the first corresponding positioning members are configured to be of the number of two members, the supporting rack includes a first side, the first side includes a first end and a second end facing toward each other, a portion of the first corresponding positioning members are arranged on the first side adjacent to the first end, another portion of the first corresponding positioning members are arranged on the first side adjacent to the second end.

14. The mainframe computer with a supporting rack according to claim 1, wherein the supporting rack includes a first side, a second side facing toward the first side and a third side connected between the first side and the second side, at least one of the first corresponding positioning member is arranged on the first side of the supporting rack, at least one of the second corresponding positioning member is arranged on the second side of the supporting rack, and at least one of the first corresponding positioning member and at least one of the second corresponding positioning member are arranged at positions in a direction facing toward each other obliquely at the third side.

* * * * *